United States Patent [19]

Gulczynski

[11] Patent Number: 4,980,649
[45] Date of Patent: Dec. 25, 1990

[54] ULTRA EFFICIENT SWITCHING POWER AMPLIFIER

[76] Inventor: Zdzislaw Gulczynski, P.O. Box 441, Winchester, Mass. 01890

[21] Appl. No.: 363,213

[22] Filed: Jun. 8, 1989

[51] Int. Cl.$^5$ .............................................. H03F 3/38
[52] U.S. Cl. ...................................... 330/10; 330/251
[58] Field of Search ............ 330/10, 146, 165, 207 A, 330/251; 332/110; 323/283; 363/26, 41; 375/22

[56] References Cited

U.S. PATENT DOCUMENTS

| | | | |
|---|---|---|---|
| 4,326,170 | 4/1982 | Levy | 330/10 |
| 4,571,551 | 2/1986 | Trager | 330/10 |
| 4,763,080 | 8/1988 | Gukzynski | 330/10 |

Primary Examiner—Steven Mottola

[57] ABSTRACT

The switching power amplifier has a low number of components, short response time and extremely high efficiency. The amplifier comprises a generator circuit providing an AC signal. A diode bridge rectifies the AC signal and provides two signals substantially equal to zero or having opposite polarities. Two inductors are coupled to the amplifier output for providing the output signal. Two switches selectively apply the rectified signals to the inductors in response to the amplifier input signal. Two input capacitors, preferably having small values, are separately coupled to the rectified signals for storing DC voltages. Two or three rectifiers apply flyback voltages of the inductors to the input capacitors. An output capacitor stores the amplifier output signal.

8 Claims, 3 Drawing Sheets

ULTRA EFFICIENT SWITCHING POWER AMPLIFIER

CROSS REFERENCE TO RELATED INVENTIONS

This invention is related to: "Switching Power Apparatus with 3-State Driver" U.S. patent application Ser. No. 517,853 filed 05/02/90; "Bidirectional Switching Power Apparatus with AC or DC Output" U.S. patent application Ser. No. 518,080 filed 05/02/90; "Capacitive Load Driver with Binary Output" U.S. patent application Ser. No. 474,488 filed 02/02/90; "ULtra Fast Logic with Temperature Compensation and Minimized Supply Voltage" U.S. patent application Ser. No. 474,489 filed 02/02/90"3-Terminal Bidirectional Switching Power Supply with AC or DC Input and AC or DC Output" U.S. patent application Ser. No. 444,729 filed 12/01/89; "Switching Power Supply with Constant to Sinusoidal Input Current and with Fixed or Variable Output Voltage" U.S. patent application Ser. No. 444,730 filed 12/01/89; "Switching Power Supply with Constant or Sinusoidal Input Current" U.S. patent application Ser. No. 383,391 filed 08/14/89; "Switching Power Supply Comprising Pair of Converters for Obtaining Constant or Sinusoidal Input Current and Fixed or Variable Output Voltage" U.S. patent application Ser. No. 383,392 filed 08/14/89; "Synchronous Switching Power Supply Comprising Buck Converter" U.S. patent application Ser. No. 363,325 filed 06/08/89 herewith; "Synchronous Switching Power Supply Comprising Boost or Flyback Converter" Ser. No. 363,326 filed 06/08/89 herewith; "Synchronous Switching Power Supply with Boost and/or Flyback Converter" U.S. patent application 363,327 filed 06/08/89 herewith; "High Power Switching Power Supply" U.S. Pat. No. 4,947,308 dated 08/07/90; "High Efficiency Power Factor Correction Circuit" U.S. Pat. No. 4,949,234 dated 08/14/90; "High Power Switching Power Supply with High Power Factor" U.S. Ser. No. 304,509 filed 01/31/89; "Power Switch Driver" U.S. Pat. No. 4,940,906 dated 07/10/90; "Synchronous Switching Power Supply with Flyback Converter" U.S. Pat. No. 4,853,837 dated 08/01/89; "Ultra Fast Logic " U.S. Pat. No. 4,943,740 dated 07/24/90; "Analog Power Amplifier" U.S. Pat. No. 4,866,398 dated 09/12/89; "High Efficiency Power Amplifier Comprising Multilevel Power Supply" U.S. Pat. No. 4,871,980 dated 10/03/89; "Switching Power Amplifier" U.S. Pat. No. 4,763,080 dated 08/09/88; "Switching Circuits Performing Thyristor and Triac Functions" U.S. Pat. No. 4,845,391 dated 07/04/89; "Switching Power Supply" U.S. Pat. No. 4,803,610 dated 02/07/89; "Power Amplifier" U.S. Pat. No. 4,782,306 dated 11/01/88; "Switching Power Supply" U.S. Pat. No. 4,736,286 dated 04/05/88; and "Push-Pull Power Amplifier" U.S. Pat. No. 4,476,441 dated 10/09/84. All inventions are by the same inventor.

BACKGROUND OF THE INVENTION

The invention relates to a switching power amplifier (SPA) having an extremely high efficiency, e.g. for high power audio amplification. The SPA operates at high switching frequency and includes a switching power supply (SPS) with line isolation.

Power amplifiers are devices designed to amplify an input signal and provide an undistorted output signal which is independent of supply voltages, load fluctuations over frequency, operating temperature, etc. Specifically, SPAs provide significantly higher efficiency by employing high speed switches.

The disadvantages of conventional SPAs are many. The audio signal is usually converted into a specific pulse width modulated signal (PWM) which is a combination of analog and digital signals. The pulse width can have any value within a switching period and is influenced by all kinds of errors. Each of the complementary output transistors must switch a least once within the high frequency period. A poor tracking of the transistor switching times results in asymmetric errors in pulse width. Power supply ripples and pulse amplitude errors depend on output power which increases distortion level, particularly near crossover point. Pulses are lost near extremes of modulation. A dead time of the transistors is inevitable in order to prevent overlapping of the conduction phases thereof due to drive asymmetry, poor transistor recovery characteristics or inadequate deadband of a control circuitry.

Furthermore, the output filter in resonant configuration is designed for one specific frequency. Its performance is poor due to regulation concepts, such as the PWM, rather than practical limitations of the components. A very high switching frequency is necessary, mostly tens of times higher than a maximum frequency of the amplified signal. This results in a further reduced efficiency and a relatively high distortion level due to the limited switching performance of the power switches. Another unsolved problem is a desirable load having a relatively stable impedance over frequency. The equivalent switching frequency of the individual transistors is actually significantly higher as the switching times thereof are a fraction of the switching period. An SPS for stabilizing supply voltages is common. This further increases the complexity and in most cases generates a huge amount of EMI/RFI, especially into the line. Numerous interference suppressors and protection circuits ar inevitable.

In conclusion, except for a small size and higher efficiency of a common SPA there is no reason for a user to give preference to it over a conventional analog power amplifier.

SUMMARY OF THE INVENTION

Accordingly, the present invention is intended to provide an SPA having a low number of components, short response time and extremely high efficiency. The present embodiments are operable with a pair of bidirectional or unidirectional switches. The generator means includes an SPS with line isolation for providing high frequency AC signal. This signal is selectively applied to an LC-network. The efficiency is further increased by adequately operating the switches.

Considering limitations of real world, an ideal SPA should exhibit in particular:

an SPS for providing line isolation and converting line voltage into high frequency square wave voltage;

unstabilized, crudely filtered supply voltages;

possibility of amplifying DC input signal as in most analog power amplifiers;

no bulk capacitors as they are large in size, cause surge charging currents and are useless at very low output frequencies anyway;

possibility of using an input comparator having variable hysteresis since the distortion level depends on output voltage level;

possibility of shutting the SPS off as to switch at ground potential;

no low-pass output filter designed for one frequency due to a complexity, sluggish response, poor performance under difficult loads, etc.;

a pair of switches to accomplish push-pull output stage;

no critical timing problems such as overlapping of conduction phases;

possibility of turning the switches on and off for any period of time but without exceeding voltage and current ratings;

no voltage spikes, no transient voltage suppressors, no snubbers, etc.;

peak current conducted by rectifiers and switches slightly higher than maximum output current of the SPA;

no inrush and no surge currents; and zero voltage and zero current switching.

An SPA according to the present invention meets all these requirements.

In one embodiment the SPA includes a generator means for providing an AC signal, a node, a switching means responsive to the input signal for selectively applying the AC signal to the node, a capacitive means coupled to the node for storing and limiting a voltage thereat, and an inductive means coupled to the node for providing the output signal. The SPA may further include a second inductive means coupled in series with the capacitive means for limiting a current flowing therethrough.

In another embodiment the SPA includes a generator means for providing an AC signal, an input rectifying means for rectifying the AC signal and providing a pair of signals substantially equal to zero or having opposite polarities, a pair of inductive means coupled to the output for providing the output signal, a pair of switching means each for selectively applying one of the rectifying means signals to one of the inductive means in response to the input signal, a pair of input capacitive means separately coupled to the input rectifying means signals for storing DC voltages, an output rectifying means for applying flyback voltages of the inductive means to the input capacitive means, and an output capacitive means coupled to the output for storing the output signal.

BRIEF DESCRIPTION OF THE DRAWINGS

The present invention will become more clear in conjunction with the accompanying figures throughout which similar references denote similar parts and of which.

DETAILED DESCRIPTION OF THE INVENTION

Figure 1:
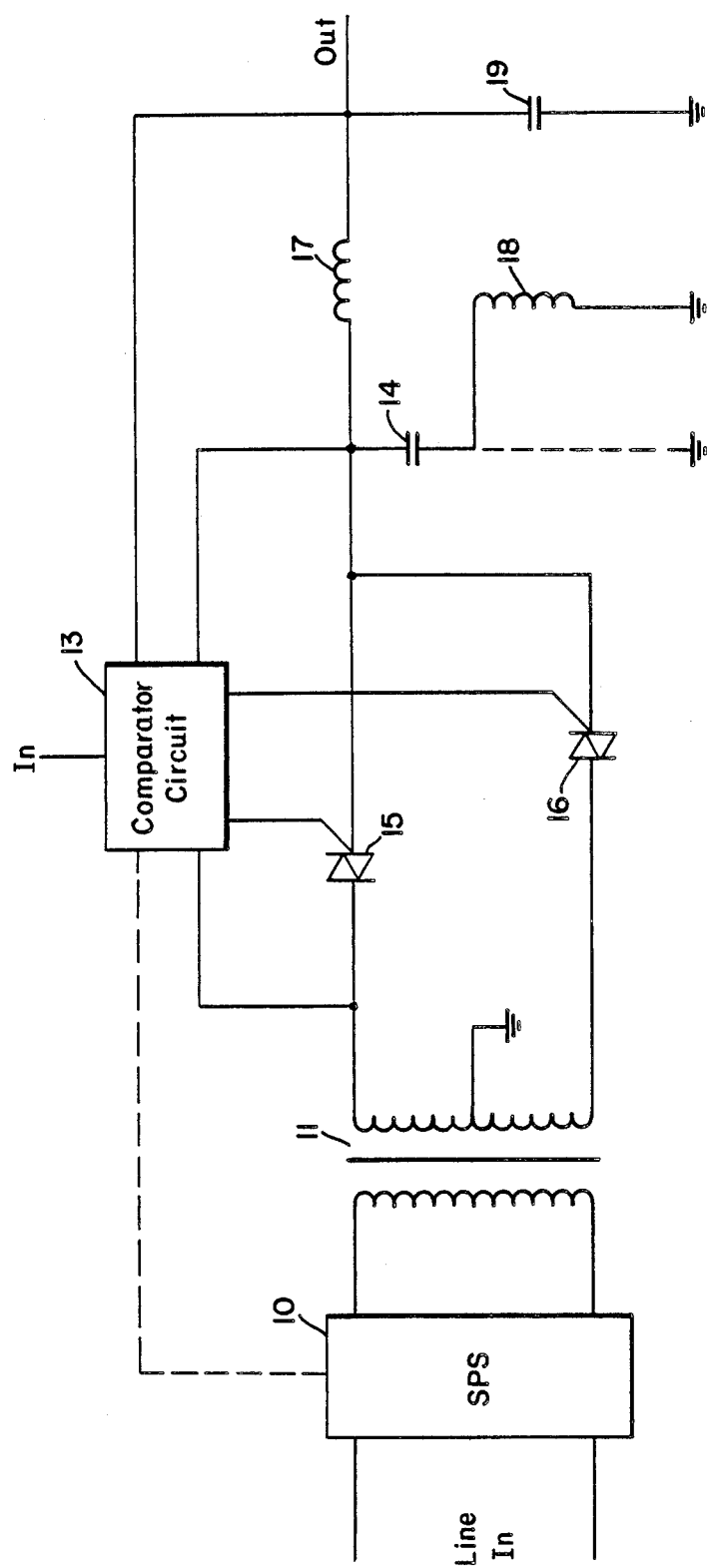
FIG. 1 is an embodiment of the SPA with a resonant network.

FIG. 1 is an embodiment of the SPA with a resonant network. The SPS 10 and transformer 11 constitute a generator means. The transformer 11 is shown as separate block rather than part of the SPS 10 as to point out that the output signal of the generator means, referred to as generator signal or generator output voltage, is AC. The SPS 10 is coupled to line, wherein the transformer 11 also provides for line isolation. The secondary of the transformer 11 has center-tap coupled to ground and supplies the generator signal having a high frequency. The generator signal has a pair of signals which are substantially equal to zero or have opposite polarities, and are separately applied to a pair of bidirectional switches.

The comparator circuit 13 and bidirectional switches 15, 16 constitute a switching means which is responsive to the SPA input signal for selectively applying the generator signal to a node. Specifically, the triacs 15, 16 are coupled across the secondary of the transformer 11 and further to the node for selectively applying the generator signal thereto as to provide a correction of the SPA output signal. The comparator circuit 13 monitors the generator output voltage, voltage at the node, SPA input and output signals as to control the triacs 15 and 16. By these means the value and polarity of the generator signal allowing the correction are determined.

In particular, the comparator circuit 13 comprises an input comparator which compares the SPA input signal against the SPA output signal. The input comparator may have a hysteresis which varies with the SPA output voltage since the distortion level depends thereon. The technique has been disclosed in the abovementioned "Switching Power Supply" U.S. Pat. No. 4,803,610 dated 02/07/89, by the same inventor. The technique is further considered in the abovementioned "Switching Power Amplifier" U.S. Pat. No. 4,763,080 dated 08/09/88, by the same inventor.

The capacitor 14 is coupled to the node for storing and limiting a voltage thereat. In one embodiment, the capacitor 14 is coupled to ground, whereby the current flowing thru the triacs 15, 16 must be limited. For instance, the secondary of the transformer 11 may have an output impedance, including leakage inductance. A possible excessive voltage across the triacs 15 and 16 can be eliminated by a single voltage suppressor coupled across the secondary or a pair of voltage suppressors separately coupled across the triacs 15 and 16. However, the triacs 15 and 16 are inherently turned off at zero voltage and zero current. The center-tap of the secondary is connected to ground so that voltages applied to the triacs 15 and 16 are substantially equal to zero or have opposite polarities. The triacs 15 and 16 selectively apply one of the voltages to the node.

The generator signal preferably has limited rise and fall times while the triac 15 or 16 is closed. For instance, the SPS 10 may operate in resonant mode. The triac 15 or 16 is closed when respective voltage provided by the secondary is substantially equal to a momentary value of the voltage across the capacitor 14. Moreover, a slope of the respective voltage is rising or falling when the SPA output signal is to be increased or decreased respectively. Subsequently, the capacitor 14 is recharged to a lower voltage respectively.

Only one of the triacs 15 or 16 may be closed at a time. The respective triac is turned off automatically when voltage thereacross changes polarity. Subsequently, the capacitor 14 acts as voltage source. The capacitor 14 takes over a current flowing thru the inductor 17 and prevents any voltage spikes at the node. Therefore, bidirectional switches of other types, if substituted for the triacs 15 and 16, can be open at any time. Closing both triacs 15 and 16 results merely in short circuit current which is sustained by SPS 10. In contrast, discharging a pair of bulk capacitors in conventional SPAs would destroy the pair of switches corresponding to the triacs 15 and 16.

An inductive means is coupled to the node for providing the SPA output signal. Specifically, the inductor 17 is coupled between the node and SPA output for attaining the current responsive to the voltage across the capacitor 14. The capacitor 19 is coupled between SPA output and ground to further reduce a high frequency ripple of the SPA output signal. The capacitor 19 may be also a portion of a load coupled to the SPA output. The inductor 17 and capacitor 19 operate thus as a filter having low-pass properties. The inductor 17 is coupled prior to the load, e.g. a loudspeaker, and has the purpose of smoothing out the high frequency generator signal. Therefore, the inductor 17 and capacitor 19 can be even more accurately defined as a time constant network since the result is a corrective noise signal superimposed onto the SPA output signal.

The switching frequency of the SPS 10 can be changed to increase efficiency of the SPA. Also energy delivered by the SPS 10 can be reduced by operating only some switches thereof. Therefore, the switching means provides a feedback signal to the generator means. In particular, an approximate value of the SPA output voltage is sufficient to determine the operating conditions of the SPS 10. The feedback can also provide an information about the output current of the SPA for determining short circuit condition, character of the load, etc. For instance, any switching can cease for a long time as in case of a low frequency small output signal or a capacitive load.

In another embodiment, a second inductive means is coupled in series with the capacitive means for limiting a current flowing therethrough. Specifically, the inductor 18 is coupled in series with the capacitor 14, whereby a resonant network is established. Moreover, the generator means providing a square wave voltage can be employed. It is further assumed that the generator means provides a square wave voltage having a fixed amplitude which is higher than desired maximum output voltage of the SPA. Therefore, the transformer 11 provides a pair of voltages substantially equal to zero or E and $-E$.

In one mode of operation, the switching frequency of the SPS 10 and resonant frequency of the resonant network have the same magnitude. After closing the triac 15 or 16, the current flowing therethrough is:

$$i = J \cos\omega t + (E - VO)/Z \sin \omega t$$

The voltage across the capacitor 14 is:

$$V = E - (E - VO)\cos\omega t - JZ \sin \omega t$$

J is a current flowing to the SPA output and thru the inductor 18 while closing the respective triac. J is also considered a current flowing thru the inductor 17 as the inductance thereof is significantly higher than of the inductor 18. E is the generator means output voltage, now appearing at the node. VO is a voltage across the capacitor 14 while closing the respective triac. Z is the impedance of the capacitor 14. $\omega$ is equal $2\pi f$, where f is resonant frequency of the resonant network. Moreover, $$\omega^2 LC = 1$$

L is the inductance of the inductor 18. C is the capacitance of the capacitor 14, wherein $Z = 1/(\omega C)$. The triac current reaches its peak after T/4 and before T/2, where $T = 1/f$. The value of the peak current is:

$$iMAX = J + \sqrt{J^2 + (E - VO)^2/Z^2}$$

The voltage across the capacitor 14 is then $V = E$.

The operation of the SPA will become more clear by analyzing an example of the generator means whose switching frequency is approximately 2 times larger than the resonant frequency. Furthermore, the output voltage of the SPA is too low and J is positive. The voltage at anode of the triac 15 has just reached value E. The triac 15 is closed so that the voltage at the node is also equal E. After period of time T/4, the anode voltage of the triac 15 is switched from E to $-E$. The current flowing thru the triac 15 at this moment is:

$$i(T/4) = J + (E - VO)/Z$$

The voltage across the capacitor 14 is then:
$$V(T/4) = E - JZ$$

E is always higher than VO so that i(T/4) is greater than J. Therefore, a current continues to flow thru the triac 15. The inductance of the inductor 17 is significantly higher than of 18 so that the triac current reaches zero after a short period of time. In particular, the current flowing thru the capacitor 14 changes value from i(T/4) to $-J$. As a result, the triac 15 is automatically turned off. The comparator circuit 13 determines that by sensing voltage at the node. Subsequently, the triac 16 can be turned on as to restore voltage at the node to E, if further increase of the SPA output voltage is desired. The triac 15 may be also closed again so that the voltage at the node is switched to $-E$. If the triacs 15 and 16 are off, the capacitor 14 acts as voltage source.

In another mode of operation, the switching frequency of the SPS 10 is significantly higher than the resonant frequency of the resonant network. After closing the triac 15 or 16, the current flowing therethrough is:

$$i = J\omega^2 t^2/2 + (E - VO)\omega t/Z$$

The voltage across the capacitor 14 is:

$$V = (E - VO)\omega^2 t^2/2 - JZ1\text{-}7\, t + VO$$

The current flowing thru the inductor 18 is compared against the current flowing thru the inductor 17, i.e. i is compared against J respectively. If i is greater than J, the generator output voltage is switched, whereas a current continues to flow thru the respective triac. The inductance of the inductor 17 is significantly higher than of the inductor 18 so that the triac current reaches zero after a short period of time. As a result, the respective triac is automatically turned off. Subsequently, one of the triacs can be turned on as to apply either E or -E to the node. Otherwise, capacitor 14 acts as voltage source.

If the inductor 18 is coupled in series with the capacitor 14, the triacs 15 and 16 are turned on at zero current and turned off inherently at zero voltage and zero current. Any voltage spikes are eliminated, wherein no clamping diodes are employed. Moreover, no conversion of the generator signal into fixed DC voltage takes place. If VO is above a positive threshold and to be decreased or below a negative threshold and to be increased, the triac 16 or 15 is turned on respectively. However, the switching of the generator means can be interrupted so that the generator output voltage is zero. Thereby, the SPA output is effectively coupled to ground via the inductor 17 and the capacitor 14 is coupled across the inductor 18. The energy loss is minimal since the switching losses of the generator means are nil.

Employment of high speed high efficiency triacs is recommended, such as disclosed in the abovementioned "Switching Circuits Performing Thyristor and Triac Functions" U.S. Pat. No. 4,845,391 dated 07/04/89, by the same inventor. Also unidirectional switches can be employed as shown in FIGS. 2 and 3.

Figure 2:
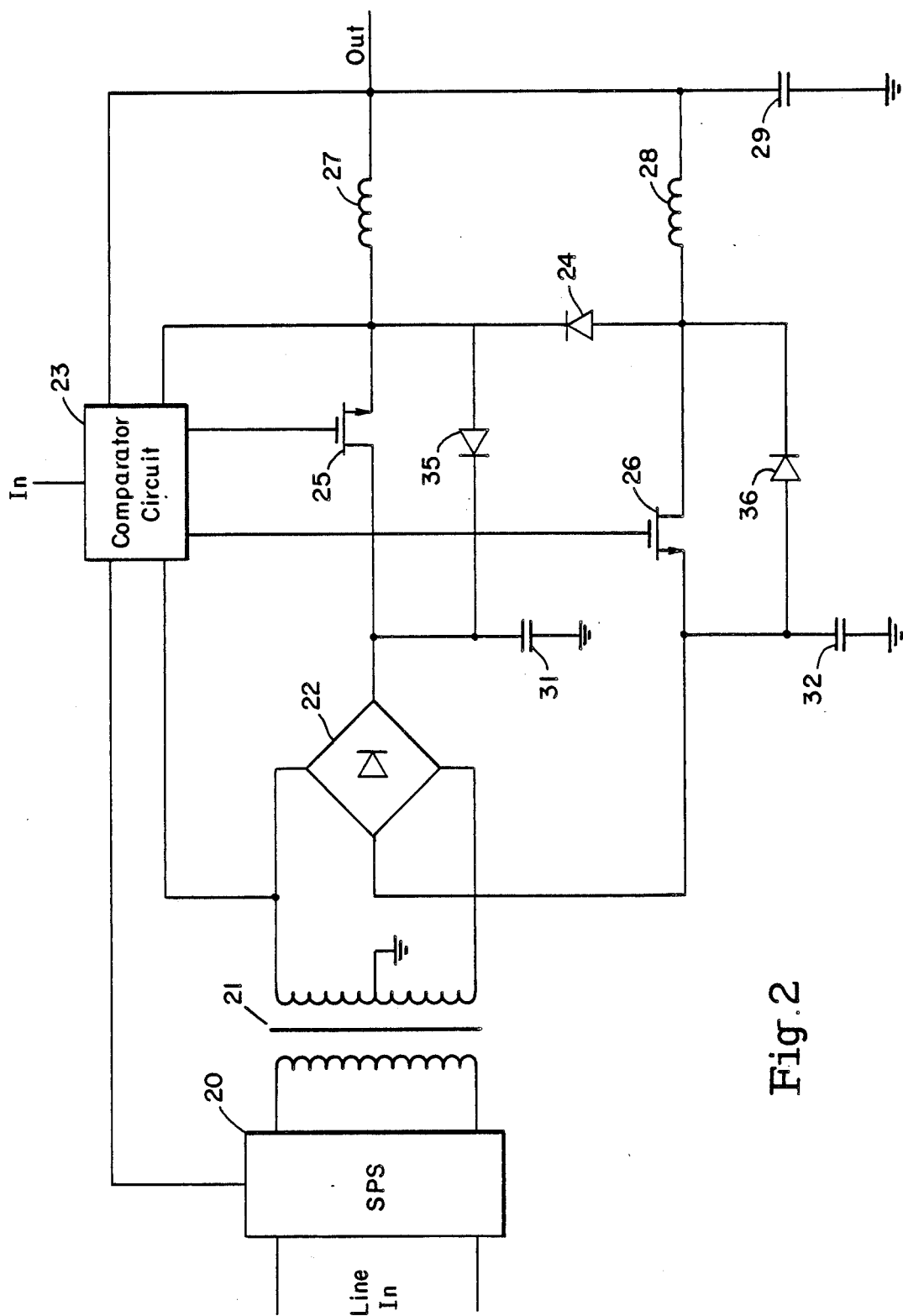
FIG. 2 is the preferred embodiment of the SPA with two capacitors and three diodes for preventing voltage spikes and causing switching at zero voltage.
Figure 3:
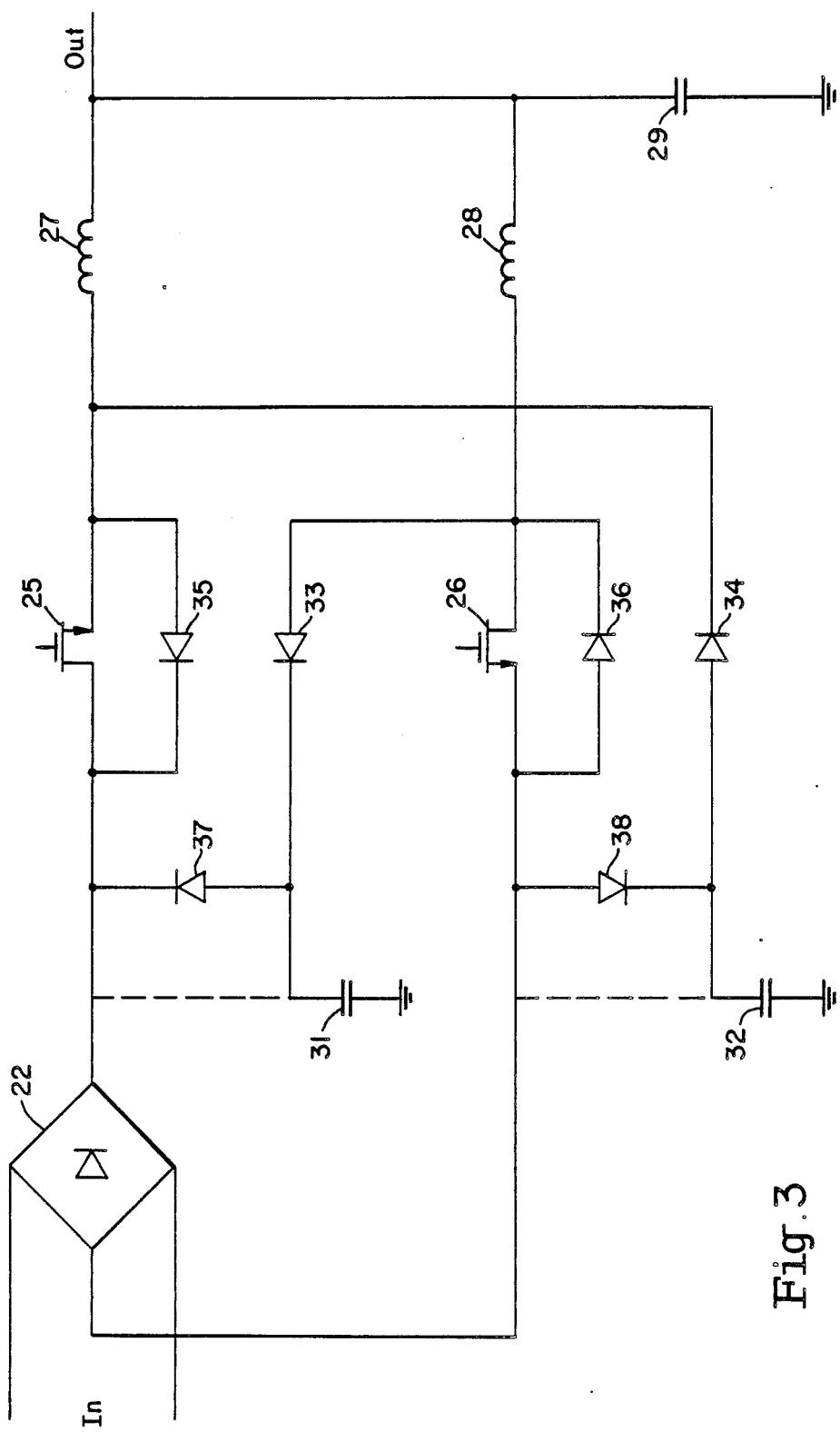
FIG. 3 is an embodiment of the SPA with a pair of capacitors and a pair of diodes for preventing voltage spikes.

FIG. 2 is the preferred embodiment of the SPA with two capacitors and three diodes for preventing voltage spikes and causing switching at zero voltage. Peak current conducted by the switches is reduced by eliminating any capacitor operating as buffer between the switches and SPA output. The peak current may be just slightly higher than maximum output current of the SPA. However, diode means must be employed in order to prevent voltage spikes.

The SPS 20 and transformer 21 constitute the generator means. The transformer 21 is shown as separate block rather than part of the SPS 20 as to point out that the generator signal is AC. The secondary of the transformer 21 has center-tap coupled to ground and is further coupled to a full wave rectifier. Specifically, the diode bridge 22 is rectifying the generator signal and providing a pair of rectified signals substantially equal to zero or having opposite polarities. The generator means provides a square wave voltage having a fixed amplitude which is higher than desired maximum output voltage of the SPA. Therefore, the transformer 21 provides a pair of voltages substantially equal to zero or E and −E.

A pair of switching means each includes an unidirectional switch for selectively applying one of the rectifying means signals to one of inductive means in response to the SPA input signal. Specifically, the comparator circuit 23 controls the n-channel MOSFETs 25 and 26 in response to the SPA input signal. The drain and source of the transistor 25 are coupled between the positive rectified signal and inductor 27 respectively. The source and drain of the transistor 26 are coupled between the negative rectified signal and inductor 28 respectively. The inductors 27 and 28 are also coupled to the SPA output and therefore provide the SPA output signal. The capacitor 29 is coupled between SPA output and ground to store the SPA output voltage and thus reduce a high frequency ripple thereof. The capacitor 29 may be also a portion of a load coupled to the SPA output. The inductors 27, 28 and capacitor 29 operate as a time constant network rather than low-pass filter since the result is a corrective noise signal superimposed onto the SPA output signal.

The transistor 25 is turned on when the SPA output signal is to be increased and, preferably, when the generator output voltage is near zero. Subsequently, E is applied to the SPA output via the inductor 27, whereby the transistor 25 is turned on at zero current. When the transistor 25 is being turned off, a flyback voltage appears at source thereof due to magnetic energy stored in the inductor 27. Similarly, the transistor 26 is turned on when the SPA output signal is to be decreased and, preferably, when the generator output voltage is near zero. Subsequently, −E is applied to the SPA output via the inductor 28, whereby the transistor 26 is turned on at zero current. When the transistor 26 is being turned off, a flyback voltage appears at drain thereof due to magnetic energy stored in the inductor 28.

The capacitors 31 and 32 are coupled to the positive and negative rectified signals respectively for storing DC voltages. Preferably, the capacitors 31 and 32 have small values and are employed mainly for limiting flyback voltages of the inductors 28 and 27 respectively. An output rectifying means is used for applying the flyback voltages to the capacitors 31 and 32. Specifically, the diode 24 has cathode and anode coupled to the inductors 27 and 28 respectively. The diode 35 has anode and cathode coupled to the inductor 27 and capacitor 31 respectively. The diode 36 has cathode and anode coupled to the inductor 28 and capacitor 32 respectively. The diodes 35 and 36 are also coupled across the transistors 25 and 26 respectively for limiting reverse voltages appearing thereacross. The diodes 35 and 36 conduct also when SPA output voltage is higher or lower than voltage stored in the capacitor 31 or 32 respectively. The diodes 35 and 36 may be "parasitic" drain-source diodes inherent in most power MOSFETs When the transistor 25 is being turned off, the current flowing thru the inductor 27 is conducted by the diodes 24 and 36, and a negative voltage across the capacitor 32 is decreased. Thereby, the capacitor 32 limits the negative flyback voltage delivered by the inductor 27. Moreover, the drain-source voltage of the transistor 26 is equal to the forward voltage across the conducting diode 36. The transistor 26 can be turned on when the current flowing thru the diode 36 has reached zero. Therefore, the transistor 26 is turned on at zero voltage and zero current. Similarly, when the transistor 26 is being turned off, the current flowing thru the inductor 28 is conducted by the diodes 24 and 35, and a positive voltage across the capacitor 31 is increased. Thereby, the capacitor 31 limits the positive flyback voltage delivered by the inductor 28. The diode 35 is conducting. The transistor 25 is turned on at zero voltage and zero current.

The diode 24 has cathode and anode coupled to the inductors 27 and 28 respectively for applying the flyback voltage of any one inductor to the other inductor. In particular, when the transistor 25 or 26 is being turned off, the diode 24 conducts and the inductors 27 and 28 are coupled in parallel. For instance, after turning the transistor 26 off, the flyback voltage of the inductor 28 is applied to the capacitor 31 via conducting diodes 24 and 35. The diode 35 conducts for the time period equal to JL/V, where J is current of the transistor 25 at the moment of its switching, L is combined inductance of the inductors 27 and 28, now coupled in parallel, and V is a difference between voltages across the capacitors 29 and 31. After the time JL/V, the diode 35 is cut off and diode 24 conducts a current equal J/2.

In contrast to conventional SPAs, the capacitors 31 and 32 can have small values and be fully discharged. It is advantageous that one rectified voltage is near zero while the other is substantially equal to the SPA output voltage. The switching means provide a feedback signal to the generator means. Specifically, the comparator circuit 23 provides the feedback signal to the SPS 20 in response to the generator output voltage, SPA input and output voltages. For instance, if the SPA output voltage is above a positive threshold and to be decreased or below a negative threshold and to be increased, the transistor 26 or 25 is turned on respectively. However, the switching of the generator means can be interrupted so that the generator output voltage is zero. Thereby, the SPA output is effectively coupled to ground via the inductor 27 or 28. Energy loss is minimal since the switching losses of the generator means are nil.

The voltage appearing at drain of the transistor 25 is the voltage stored in the capacitor 31 or positive rectified voltage, whichever is higher. The voltage appearing at the source of the transistor 26 is the voltage stored in the capacitor 32 or negative rectified voltage, whichever is lower. A switching of only one of the transistors 25 or 26 may result in an excessive voltage across the capacitor 32 or 31 respectively. This is detected by the comparator circuit 23 which senses the voltage at cathode of the diode 24. The other transistor can be turned on as to eliminate the excessive capacitor voltage. In particular, both transistors 25 and 26 can be turned on. In contrast to conventional SPAs, the problem of overlapping conduction phases of the output transistors does no exist.

FIG. 3 is an embodiment of the SPA with a pair of capacitors and a pair of diodes for preventing voltage spikes. The components 22, 31, 32, 35, 36 and 25 thru 29 are coupled as in FIG. 2 and therefore have the same reference numbers. In particular, a high frequency AC generator signal is applied to the diode bridge 22 which provides a pair of rectified signals substantially equal zero or having opposite polarities. A pair of switching means is employed for selectively applying the rectified signals to a pair of inductive means in response to the SPA input signal. Each switching means includes an unidirectional switch.

Specifically, the drain and source of the n-channel MOSFET 25 are coupled between the positive rectified signal and inductor 27 respectively. The source and drain of the n-channel MOSFET 26 are coupled between the negative rectified signal and inductor 28 respectively. The transistors 25 and 26 are controlled by a comparator circuit such as 23 of FIG. 2. The inductors 27, 28 are coupled to the SPA output and therefore provide the SPA output signal. The inductors 27, 28 and capacitor 29 operate as a time constant network rather than low-pass filter since the result is a corrective noise signal superimposed onto the SPA output signal.

The transistor 25 is turned on when the SPA output signal is to be increased and, preferably, when the generator output voltage is near zero. Subsequently, E is applied to the SPA output via the inductor 27, whereby the transistor 25 is turned on at zero current. When the transistor 25 is being turned off, a negative flyback voltage appears at source thereof due to magnetic energy stored in the inductor 27. Similarly, the transistor 26 is turned on when the SPA output signal is to be decreased and, preferably, when the generator output voltage is near zero. Subsequently, −E is applied to the SPA output via the inductor 8, whereby the transistor 26 is turned on at zero current. When the transistor 26 is being turned off, a positive flyback voltage appears at drain thereof due to magnetic energy stored in the inductor 28.

The capacitors 31 and 32 are coupled to the positive and negative rectified signals respectively for storing DC voltages. Preferably, the capacitors 31 and 32 have small values and are employed mainly for limiting flyback voltages of the inductors 28 and 27 respectively.

An output rectifying means is used for applying the flyback voltages to the capacitors 31 and 32. Specifically, the diode 33 has anode and cathode coupled to the inductor 28 and capacitor 31 respectively. The diode 34 has cathode and anode coupled to the inductor 27 and capacitor 32 respectively. By these means, the diodes 33 and 34 apply flyback voltages of the inductors 28 and 27 to the capacitors 31 and 32 respectively. Consequently, the inductor 27 is coupled to the capacitors 31 and 32 via the transistor 25 and diode 34 respectively. The inductor 28 is coupled to the capacitors 32 and 31 via the transistor 26 and diode 33 respectively.

In contrast to conventional SPAs, the capacitors 31 and 32 can have small values and be fully discharged. It is advantageous that one rectified voltage is near zero while the other is substantially equal to the SPA output voltage. For instance, if the SPA output voltage is above a positive threshold and to be decreased or below a negative threshold and to be increased, the transistor 26 or 25 is turned on respectively. However, the switching of the generator means can be interrupted so that the generator output voltage is zero. Thereby, the SPA output is effectively coupled to ground via the inductor 27 or 28. Energy loss is minimal since the switching losses of the generator means are nil.

The voltage appearing at drain of the transistor 25 is the voltage stored in the capacitor 31 or positive rectified voltage, whichever is higher. The voltage appearing at the source of the transistor 26 is the voltage stored in the capacitor 32 or negative rectified voltage, whichever is lower. A switching of only one of the transistors 25 or 26 may result in an excessive voltage across the capacitor 32 or 31 respectively. This can be detected by a comparator circuit, such as 23 of FIG. 2, by sensing the voltage at anode of the diode 33 or cathode of the diode 34. The other transistor can be turned on to eliminate the excessive capacitor voltage. In particular, both transistors 25 and 26 can be turned on. In contrast to conventional SPAs, the problem of overlapping conduction phases of the output transistors does not exist.

The main purpose of the capacitors 31 and 32 is to limit the flyback voltages delivered by the inductors 28 and 27 respectively and thus prevent voltage spikes. However, the capacitors 31 and 32 are directly coupled to the positive and negative rectified voltages respectively. This puts an addtional load on the generator means and diode bridge 22 whenever the voltage across the capacitors 31 and 32 is smaller than E or greater than −E respectively. This may cause surge currents with the capacitors 31 and 32 having higher values.

In another embodiment, a pair of second diode means is employed for coupling the capacitors 31 and 32 to the respective rectified signals. Specifically, the diode 37 has anode and cathode coupled to the capacitor 31 and positive rectified signal respectively. The diode 38 has cathode and anode coupled to the capacitor 32 and negative rectified signal respectively. The capacitors 31 and 32 are charged thru the diodes 33 and 34, and discharged thru the transistors 25 and 26 respectively. Consequently, the voltages across the capacitors 31 and 32 may be smaller than E or greater than −E respectively.

The diodes 36 and 36 are coupled across the transistors 25 and 26 respectively for limiting reverse voltages appearing thereacross. The diodes 36 and 36 may be "parasitic" drain-source diodes inherent in most power MOSFETs. The diodes 35 and 36 may be significantly slower than 33 and 34. The diodes 36 and 36 conduct only when SPA output voltage is higher or lower than voltage stored in the capacitor 31 or 32 respectively. A pair of diodes coupled in series with the transistors 25 and 26 can be substituted for the diodes 35 and 36 respectively. However, turn-on losses are then increased. Theoretically, the diodes 36 and 36 are superfluous if the diodes 37 and 38 are employed.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Switching power amplifier for amplifying an input signal and providing an output signal at output, comprising:

a generator means for providing an AC signal;
 an input rectifying means for rectifying the AC signal and providing a pair of signals substantially equal the zero or having opposite polarities;
 a pair of inductive means coupled to the output for providing the output signal;
 a pair of switching means each for selectively applying one of the rectifying means signals to one of the inductive means in response to the input signal;
 a pair of input capacitive means separately coupled to the input rectifying means signals for storing DC voltages;
 an output rectifying means for applying flyback voltages of the inductive means to the input capacitive means; and
 an output capacitive means coupled to the output for storing the output signal.

2. Switching power amplifier of claim 1 wherein the generator means includes a transformer for providing the AC signal.

3. Switching power amplifier of claim 1 wherein the switching means provide a feedback signal to the generator means.

4. Switching power amplifier of claim 1 wherein each switching means includes an unidirectional switch.

5. Switching power amplifier of claim 1 wherein the output rectifying means includes:

a pair of first diode means separately coupled across the switching means for limiting reverse voltages appearing thereacross; and
 a second diode means for coupling one inductive means to the other inductive means.

6. Switching power amplifier of claim 1 wherein the output rectifying means includes a pair of diode means each for coupling one of the inductive to one of the capacitive means, and further wherein each inductive means is coupled to one of the capacitive means via one of the switching means and is coupled to the other capacitive means via one of the diode means.

7. Switching power amplifier of claim 6 further including a pair of second diode means separately coupled across the switching means for limiting reverse voltages appearing thereacross.

8. Switching power amplifier of claim 6 further including a pair of second diode means for coupling the capacitive means to the respective rectifying mean signals.

* * * * *